(12) United States Patent
Seo

(10) Patent No.: US 8,519,759 B2
(45) Date of Patent: Aug. 27, 2013

(54) SHIFT REGISTER AND SYNCHRONIZATION CIRCUIT USING THE SAME

(75) Inventor: Young Suk Seo, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 52 days.

(21) Appl. No.: 13/190,004

(22) Filed: Jul. 25, 2011

(65) Prior Publication Data

US 2012/0154001 A1     Jun. 21, 2012

(30) Foreign Application Priority Data

Dec. 21, 2010  (KR) .................. 10-2010-0131951

(51) Int. Cl.
*H03L 7/06* (2006.01)
(52) U.S. Cl.
USPC .......................................... 327/158; 327/149
(58) Field of Classification Search
USPC ................................. 327/149, 158
See application file for complete search history.

(56) References Cited

U.S. PATENT DOCUMENTS

2009/0146707 A1* 6/2009 Shin .............................. 327/158

FOREIGN PATENT DOCUMENTS

| KR | 1020010003993 A | 1/2001 |
| KR | 1020080079905 A | 9/2008 |

* cited by examiner

*Primary Examiner* — Adam Houston
(74) *Attorney, Agent, or Firm* — William Park & Associates Patent Ltd.

(57) ABSTRACT

A synchronization circuit includes a measurement unit configured to measure a difference between an initial delay amount of an input clock signal and an initial delay amount of a feedback clock signal and generate a phase difference detection signal, an initial delay time setting unit configured to generate an initial delay time setting signal in response to the phase difference detection signal, a shift register configured to generate a shift signal in response to the initial delay time setting signal, and a delay chain having an initial delay time set in response to the shift signal.

17 Claims, 7 Drawing Sheets

SHIFT REGISTER AND SYNCHRONIZATION CIRCUIT USING THE SAME

CROSS-REFERENCE TO RELATED APPLICATION

The present application claims priority under 35 U.S.C. §119(a) to Korean Application No. 10-2010-0131951, filed on Dec. 21, 2010, in the Korean Intellectual Property Office, which is incorporated herein by reference in its entirety as if set forth in full.

BACKGROUND

1. Technical Field

Various embodiments of the present invention relate to semiconductor circuits. In particular, certain embodiments relate to a shift register in a semiconductor apparatus and a synchronization circuit using the same.

2. Related Art

A semiconductor circuit may include a synchronization circuit such as a delay locked loop (DLL) for delay locking or a duty cycle corrector (DCC) for duty cycle correction.

The DLL is used to solve the problem of an increased output data access time due to a delay of an internal clock used in a semiconductor integrated circuit through a clock buffer and a transmission line, which may cause the phase difference between the internal clock and an external clock.

The DCC is used to correct the distortion of the duty cycle of the clock signal.

As semiconductor integrated circuits operate at a higher speed than ever, a delay locking operation and a duct cycle correction operation need to be accurately performed as fast as possible.

FIG. 1 is a block diagram of a synchronization circuit according to the conventional art. As illustrated in FIG. 1, a synchronization circuit 1 according the conventional art includes a coarse delay chain 11, a fine delay chain 12, a driver 13, a replica delay 14, a phase detector 15, a control unit 16, and a shift register 17.

The phase detector 15 detects and outputs the phase difference between an input clock signal CLKIN and a feedback clock signal FBCLK.

Based on the output signal of the phase detector 15, the control unit 16 controls the shift register 17 to perform first delay locking through changing a unit delay time of the coarse delay chain 11.

When the first delay locking is completed, the control unit 16 controls the fine delay chain 12 to perform second delay locking so that it can complete final delay locking and thus output a delay locked clock signal DLLCLK.

Since loop delay inevitably occurs in the conventional art until the feedback clock signal FBCLK is compared with the input clock signal CLKIN and the control unit 16 controls the coarse delay chain 11 and the fine delay chain 12, a substantial amount of time is required to complete the delay locking.

SUMMARY

Accordingly, there is a need for improved synchronization circuits capable of reducing the time necessary to achieve the delay locking.

To attain the advantages and in accordance with the purposes of the invention, as embodied and broadly described herein, one exemplary aspect of the present invention may provide a shift register comprising: a plurality of shift units each configured to receive a first control signal and a second control signal and generate a shift signal in response to the first control signal and the second control signal, wherein each of the plurality of shift units shift its corresponding shift signal by one cipher in response to the second control signal, and shift its corresponding shift signal by two or more ciphers in response to the first control signal.

In another exemplary aspect of the present invention, a synchronization circuit may comprise: a measurement unit configured to measure a difference between an initial delay amount of an input clock signal and an initial delay amount of a feedback clock signal and generate a phase difference detection signal; an initial delay time setting unit configured to generate an initial delay time setting signal in response to the phase difference detection signal; a shift register configured to generate a shift signal in response to the initial delay time setting signal; and a delay chain having an initial delay time set in response to the shift signal.

In another exemplary aspect of the present invention, a synchronization circuit may comprise: a delay chain configured to delay and output an input clock signal; a measurement unit configured to generate a phase difference detection signal and an initial delay time setting completion signal in response to the input clock signal and a feedback clock signal; an initial delay time setting unit configured to generate a first control signal in response to the phase difference detection signal; a control unit configured to generate a second control signal, which corresponds to a result obtained by comparing a phase of the input clock signal with a phase of the feedback clock signal, in response to activation of the initial delay time setting completion signal; and a shift register configured to set an initial delay time of the delay chain in response to the first control signal and change a delay time of the delay chain in response to the second control signal.

In another exemplary aspect of the present invention, a synchronization circuit may comprise: a measurement unit configured to generate a phase difference detection signal and an initial delay time setting completion signal in response to an input clock signal and a feedback clock signal; an initial delay time setting unit configured to generate a first control signal in response to the phase difference detection signal; a control unit configured to generate a second control signal or a third control signal, which corresponds to a result obtained by comparing a phase of the input clock signal with a phase of the feedback clock signal, in response to activation of the initial delay time setting completion signal; a first delay chain configured to delay and output the input clock signal; a second delay chain configured to delay and output an output signal of the first delay chain in response to the third control signal; and a shift register configured to set an initial delay time of the first delay chain in response to the first control signal and change a delay time of the first delay chain in response to the second control signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
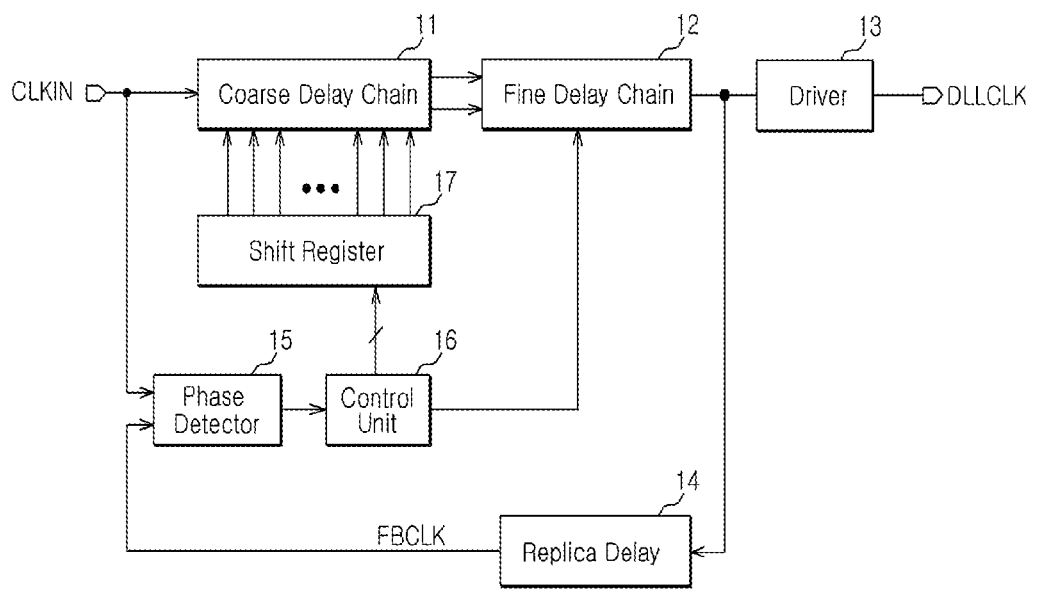
FIG. 1 is a block diagram of a synchronization circuit according to the conventional art.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
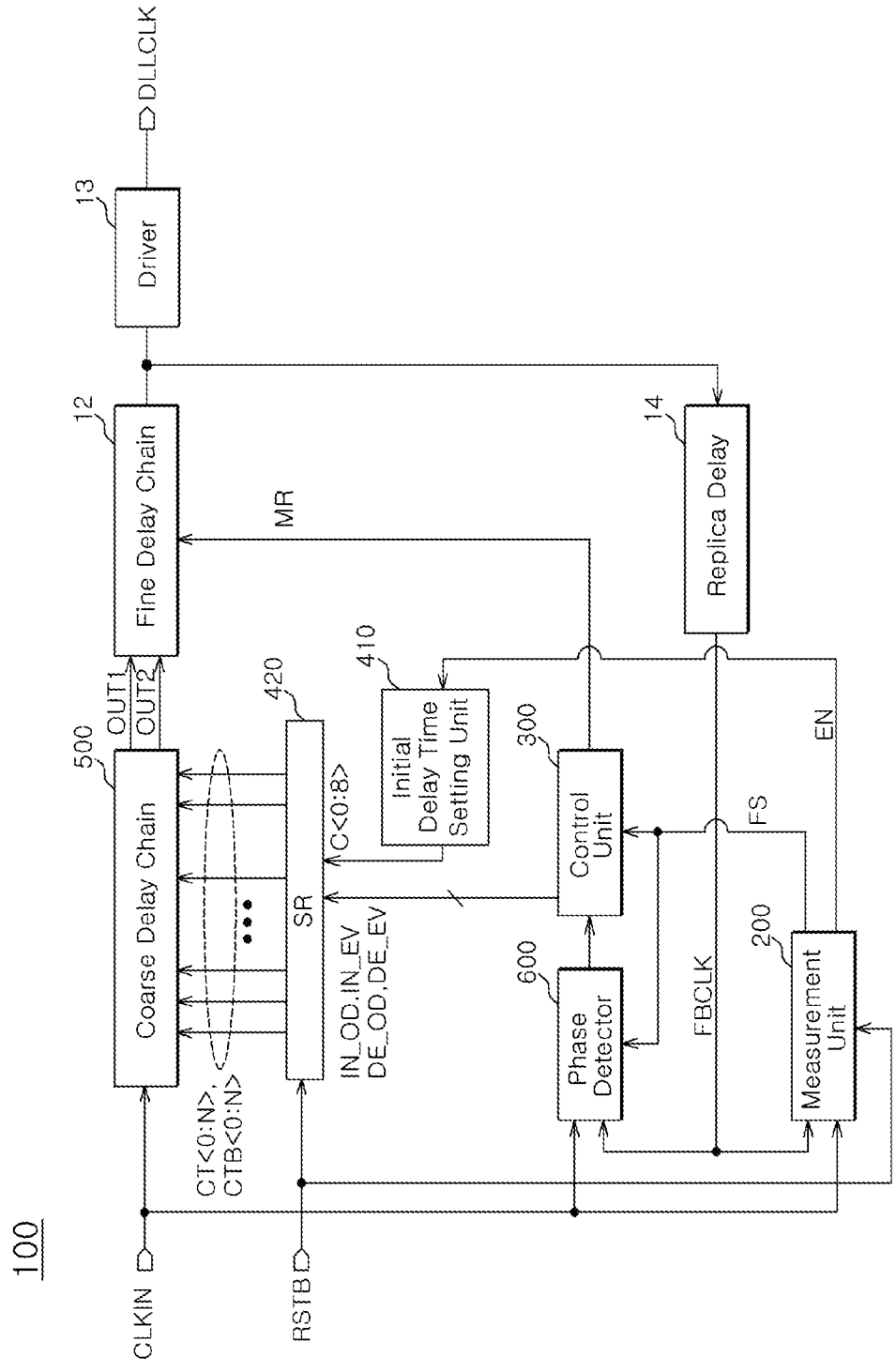
FIG. 2 is a block diagram of a synchronization circuit according to an exemplary embodiment of the invention.

FIG. 2 is a block diagram of a synchronization circuit according to an exemplary embodiment of the invention. As illustrated in FIG. 2, a synchronization circuit 100 according to an exemplary embodiment of the invention may include a coarse delay chain 500, a fine delay chain 12, a driver 13, a replica delay 14, a phase detector 600, a measurement unit 200, a control unit 300, an initial delay time setting unit 410, and a shift register 420.

The initial delay time setting unit 410 is configured to generate first control signals, that is, initial delay time setting signals C<0:8>, in response to a phase difference detection signal EN.

The control unit 300 is configured to generate second control signals, that is, delay control signals IN_OD, IN_EV, DE_OD and DE_EV, and a third control signal, that is, a mixture ratio control signal MR, in response to the output signal of the phase detector 600 and an initial delay time setting completion signal FS.

The delay control signals IN_OD, IN_EV, DE_OD and DE_EV are used to control the delay time of the coarse delay chain 500 by controlling the shift register 420, and the mixture ratio control signal MR is used to control the delay time of the fine delay chain 12.

The coarse delay chain 500 is configured to delay an input clock signal CLKIN by a variable delay time in response to shift signals CT<0:N> and CTB<0:N> and generate output signals OUT1 and OUT2.

The fine delay chain 12 is configured to mix the output signals OUT1 and OUT2 of the coarse delay chain 500 with each other at a variable mixture ratio in response to the mixture ratio control signal MR, and change the delay time of the input clock signal CLKIN in small units as compared with that of the coarse delay chain 500. The fine delay chain 12 may include a mixer.

The driver 13 is configured to drive the output signal of the fine delay chain 12 and output a delay locked loop clock signal DLLCLK.

In the replica delay 14, a delay time obtained by modeling an internal signal processing delay time of a semiconductor integrated circuit is set.

The phase detector 600 is configured to compare the input clock signal CLKIN with a feedback clock signal FBCLK in response to the initial delay time setting completion signal FS, and detect a signal with an advanced phase.

The measurement unit 200 is configured to generate the phase difference detection signal EN and the initial delay time setting completion signal FS in response to the input clock signal CLKIN and the feedback clock signal FBCLK.

The shift register 420 is configured to generate the shift signals CT<0:N> and CTB<0:N> in response to the delay control signals IN_OD, IN_EV, DE_OD and DE_EV, the initial delay time setting signals C<0:8>, and a reset signal RSTB.

The operation of the synchronization circuit 100 configured as above according to the exemplary embodiment will be described below.

Before the reset signal RSTB is activated and the initial delay time setting completion signal FS is activated, the measurement unit 200 detects the phase difference between the input clock signal CLKIN and the feedback clock signal FBCLK to output the phase difference detection signal EN.

The initial delay time setting unit 410 generates the initial delay time setting signals C<0:8> in response to the phase difference detection signal EN.

The shift register 420 generates the shift signals CT<0:N> and CTB<0:N> in response to the initial delay time setting signals C<0:8>.

The initial delay time of the coarse delay chain 500 is set in response to the shift signals CT<0:N> and CTB<0:N>, so that coarse delay locking is achieved.

A conventional coarse delay locking operation is performed by adjusting the delay time of the coarse delay chain 500 by a unit delay time through a continuous feedback operation. However, in the embodiment, a delay time corresponding to the phase difference detection signal EN is applied to the coarse delay chain 500 once, so that coarse delay locking is quickly achieved.

Then, the phase detector 600 and the control unit 300 operate in response to the activated initial delay time setting completion signal FS.

The control unit 300 generates the mixture ratio control signal MR in response to the output signal of the phase detector 600 to control the fine delay chain 12, thereby achieving the fine delay locking.

Figure 3:
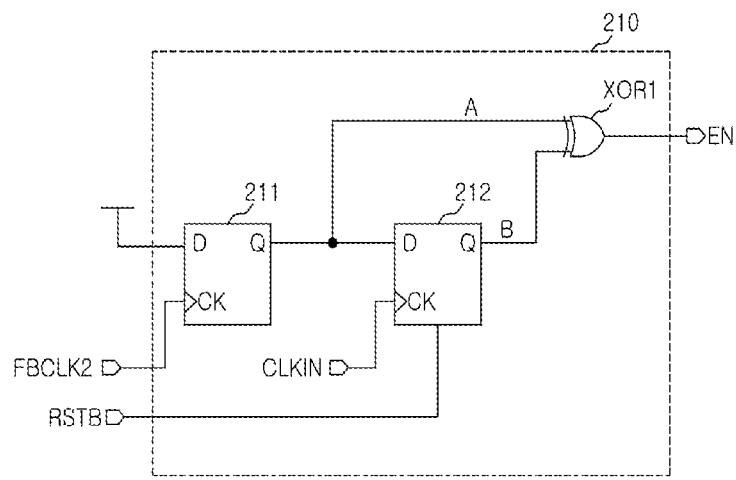
FIG. 3 is a circuit diagram of the measurement unit illustrated in FIG. 2.
Figure 3:
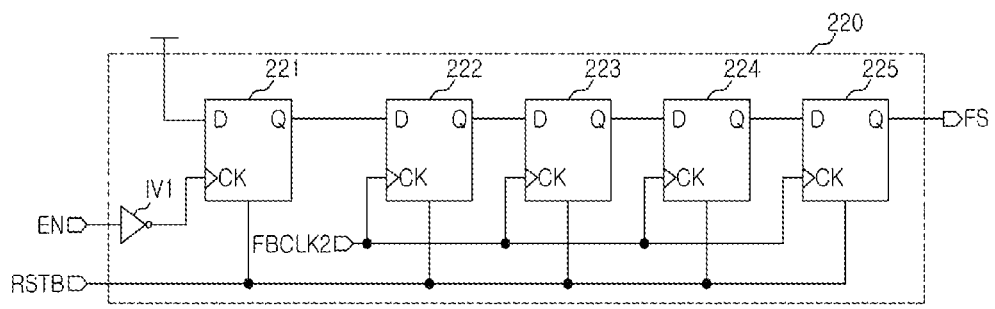
Figure 3:
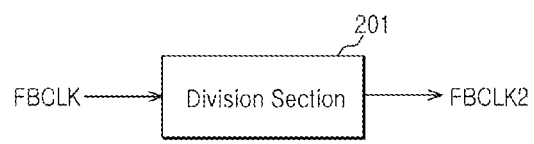

FIG. 3 is a circuit diagram of the measurement unit illustrated in FIG. 2. As illustrated in FIG. 3, the measurement unit 200 includes a division section 201, a phase difference detection section 210, and an initial delay time setting completion signal generation section 220.

The division section 201 is configured to 2-divide the feedback clock signal FBCLK and generate a divided clock signal FBCLK2.

The phase difference detection section 210 is configured to detect the phase difference between the input clock signal CLKIN and the divided clock signal FBCLK2 and generate the phase difference detection signal EN.

The phase difference detection section 210 includes a plurality of flip-flops 211 and 212 and an XOR gate XOR1.

The initial delay time setting completion signal generation section 220 is configured to output a signal, which is obtained by shifting a signal at a logic high level using the divided clock signal FBCLK2 at the timing at which the phase difference detection signal EN is at a logic low level, as the initial delay time setting completion signal FS.

The initial delay time setting completion signal generation section 220 includes an inverter IV1 and a plurality of flip-flops 221 to 225.

Figure 4:
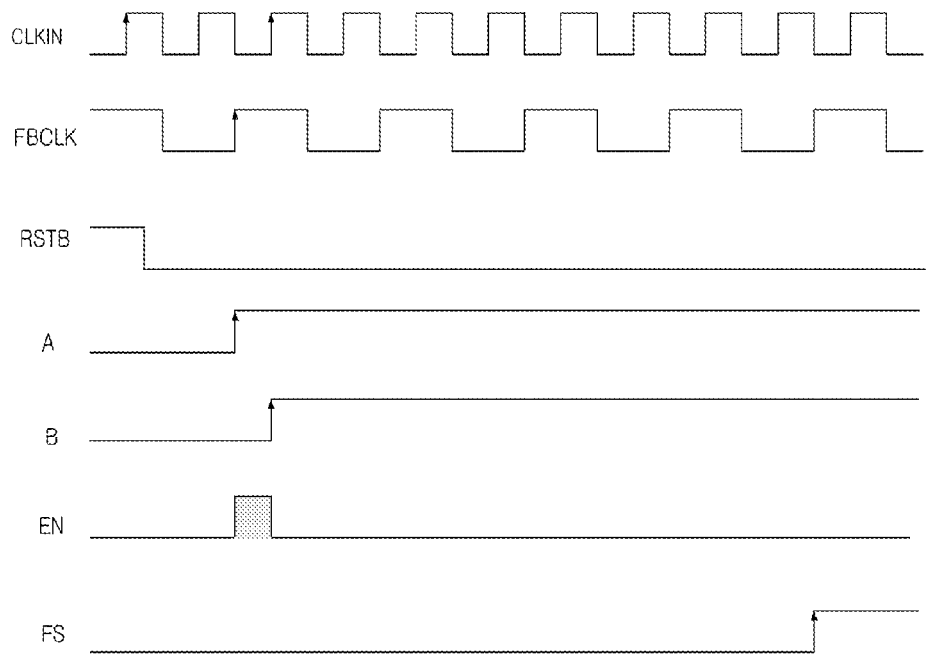
FIG. 4 is a diagram illustrating the operation timings of the measurement unit illustrated in FIG. 3.

FIG. 4 is a diagram illustrating the operation timings of the measurement unit illustrated in FIG. 3. As illustrated in FIG. 4, the flip-flop 211 of the phase difference detection section 210 receives a supply voltage level in response to the divided clock signal FBCLK2, and generates an output signal A.

The flip-flop 212 receives the output signal A in response to the input clock signal CLKIN and generates an output signal B.

The two output signals A and B are subject to an XOR operation using the XOR gate XOR1, resulting in the generation of the phase difference detection signal EN for determining the phase difference between the input clock signal CLKIN and the divided clock signal FBCLK2.

Furthermore, as the phase difference detection signal EN is at a logic low level, the initial delay time setting completion signal generation section 220 shifts a supply voltage level, which is output from the flip-flop 221, four times by using the plurality of flip-flops 222 to 225 according to the divided clock signal FBCLK2, thereby generating the initial delay time setting completion signal FS.

Figure 5:
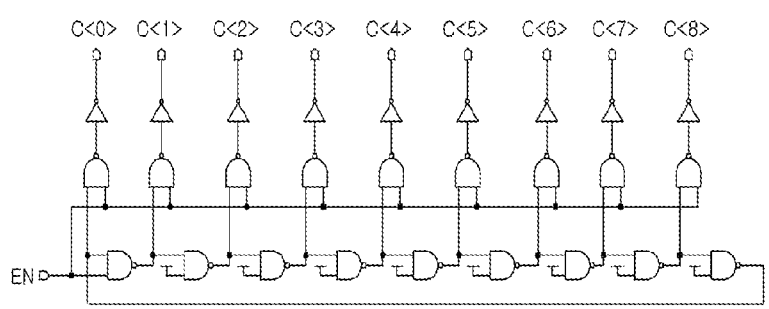
FIG. 5 is a circuit diagram of the initial delay time setting unit illustrated in FIG. 2.

FIG. 5 is a circuit diagram of the initial delay time setting unit illustrated in FIG. 2. As illustrated in FIG. 5, the initial delay time setting unit 410 may include a plurality of NAND gates with a fan-out of 2 and a ring oscillator using a plurality of inverters.

The initial delay time setting unit 410 performs an oscillation operation in response to the phase difference detection signal EN, thereby generating the initial delay time setting signals C<0:8>.

Figure 6:
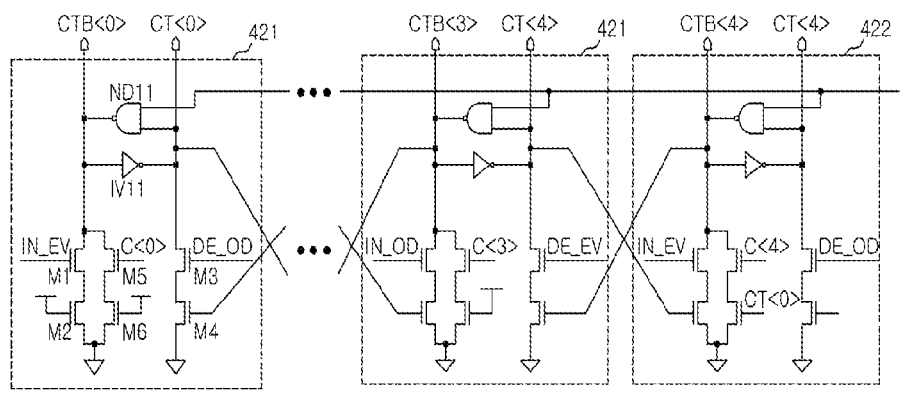
FIG. 6 is a circuit diagram of the shift register illustrated in FIG. 2.
Figure 6:
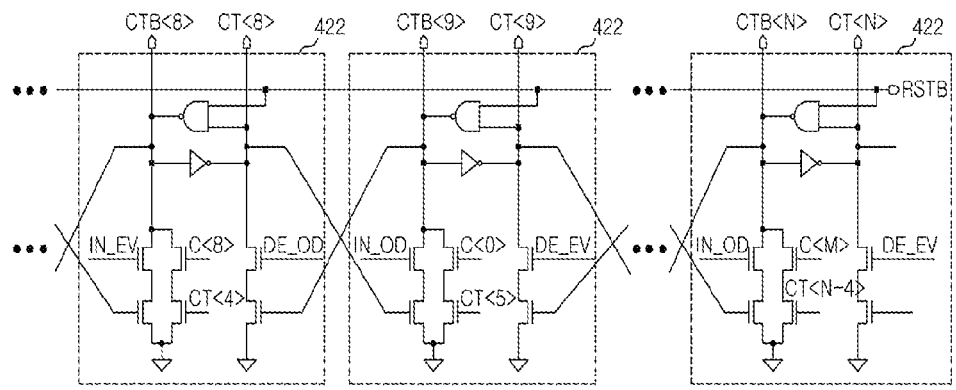

FIG. 6 is a circuit diagram of the shift register illustrated in FIG. 2. As illustrated in FIG. 6, the shift register 420 includes a plurality of shift units 421 and 422 for generating the shift signals CT<0:N> and CTB<0:N>.

Each of the shift units 421 and 422 includes a plurality of transistors M1 to M6, an inverter IV11, and a NAND gate ND11.

The transistors M1 of the shift units 421 and 422 receive delay control signals IN_OD and IN_EV, respectively at their gates, and the transistors M3 of the shift units 421 and 422 receive delay control signals DE_OD and DE_EV, respectively at their gates.

The transistors M5 of the shift units 421 and 422 sequentially receive the initial delay time setting signals C<0:8> at their gates, respectively.

When any one of the delay control signal IN_OD or IN_EV and the initial delay time setting signals C<0:8> is activated to a logic high level, the shift units 421 and 422 activate the shift signals CT<0:N> and CTB<0:N> to a logic high level and a logic low level, respectively. That is, signal bits activated among the shift signals CT<0:N> and CTB<0:N> are shifted.

When the reset signal RSTB is activated to a logic low level, the shift units 421 and 422 initialize the shift signals CT<0:N> and CTB<0:N> to a logic low level and a logic high level, respectively.

Meanwhile, the transistors M6 of the shift units 421 receive a supply voltage at their gates, and the transistors M6 of the shift units 422 sequentially receive shift signals CT<0:N-4> at their gates, respectively.

At this time, since the initial delay time setting signals C<0:8> are generated through the initial delay time setting unit 410, that is, a ring oscillator, it is normal that the initial delay time setting signals C<0:8> are sequentially generated. However, in terms of the operation characteristics of the ring oscillator, the initial delay time setting signals C<0:8> may be abnormally generated due to an abnormally generated pulse.

The shift register 420 uses the initial delay time setting signals C<0:8> in order to set the initial delay time of the coarse delay chain 500. Consequently, the shift signals CT<0:N-4> are sequentially input to the gates of the transistors M6 of the shift units 422, thereby substantially preventing shift signals CT<4:N> and CTB<4:N> from being abnormally generated due to the above-described initial delay time setting signals C<4:8>.

That is, although the initial delay time setting signals C<4:8> are activated, only when the shift signals CT<0:N-4> are activated, the shift register 420 is configured such that the shift signals CT<4:N> and CTB<4:N> are activated.

According to the embodiment, when configuring the shift register 420, a simple circuit configuration is added, that is, only the transistors M5 and M6 are added to the shift units 421 and 422, so that the shift signals CT<0:N> and CTB<0:N> for setting the initial delay time of the coarse delay chain 500 are generated using the initial delay time setting signals C<0:8> and the shift signals CT<0:N> and CTB<0:N>.

Figure 7:
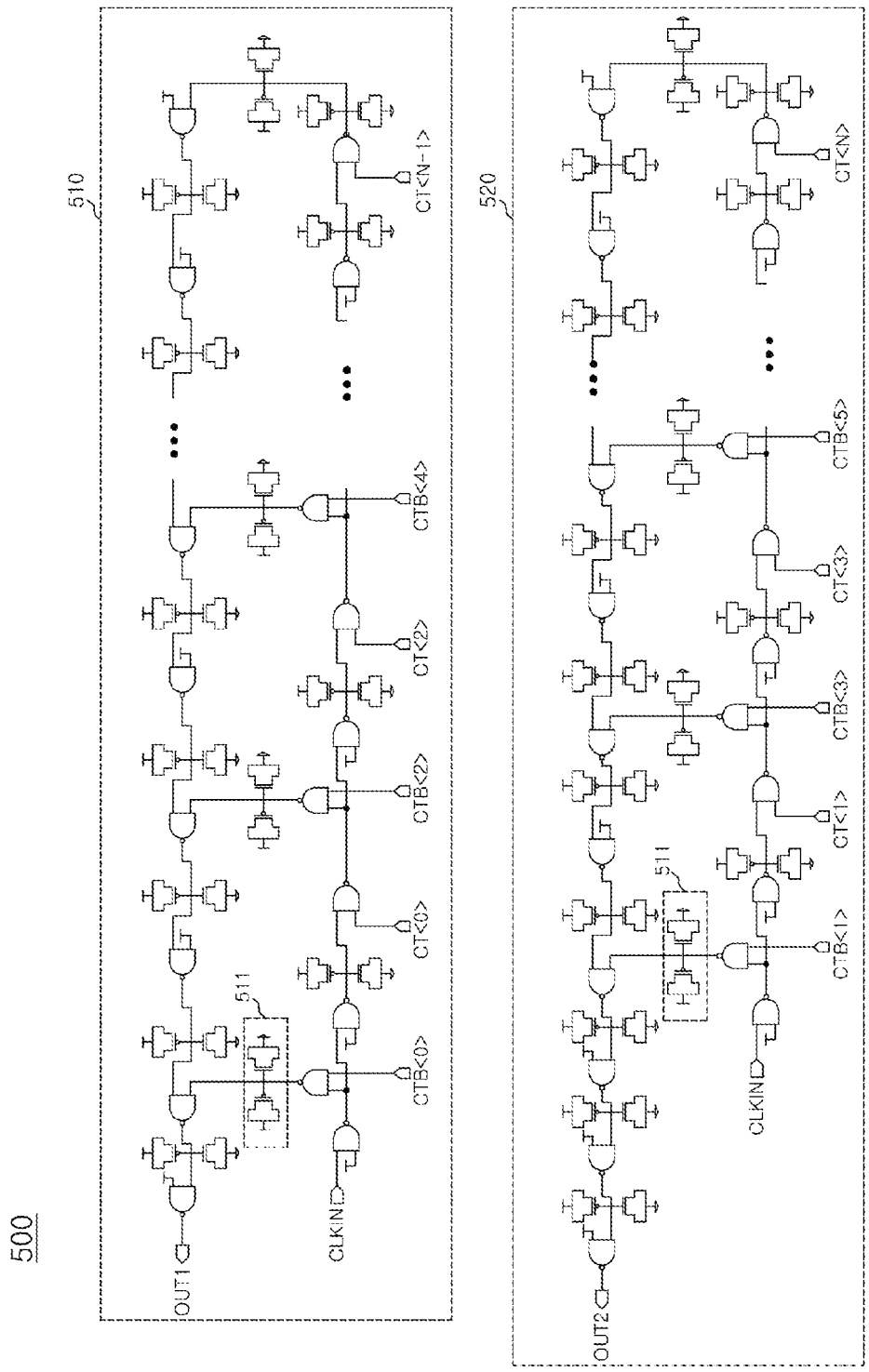
FIG. 7 is a circuit diagram of the coarse delay chain illustrated in FIG. 2.

FIG. 7 is a circuit diagram of the coarse delay chain illustrated in FIG. 2. As illustrated in FIG. 7, the coarse delay chain 500 includes a first delay chain 510 and a second delay chain 520.

The first delay chain 510 and the second delay chain 520 may have a configuration substantially identical to that of a general coarse delay chain, except that dummy transistors 511 are added to the first delay chain 510 and the second delay chain 520 for timing matching with the initial delay time setting unit 410.

Each of the first delay chain 510 and the second delay chain 520 includes NAND gates with a fan-out of 2 so that they have signal delay characteristics substantially identical to those of the initial delay time setting unit 410.

The first delay chain 510 and the second delay chain 520 delay the input clock signal CLKIN by a variable delay time in response to the shift signals CT<0:N> and CTB<0:N>, thereby generating the output signals OUT1 and OUT2, respectively.

Figure 8:
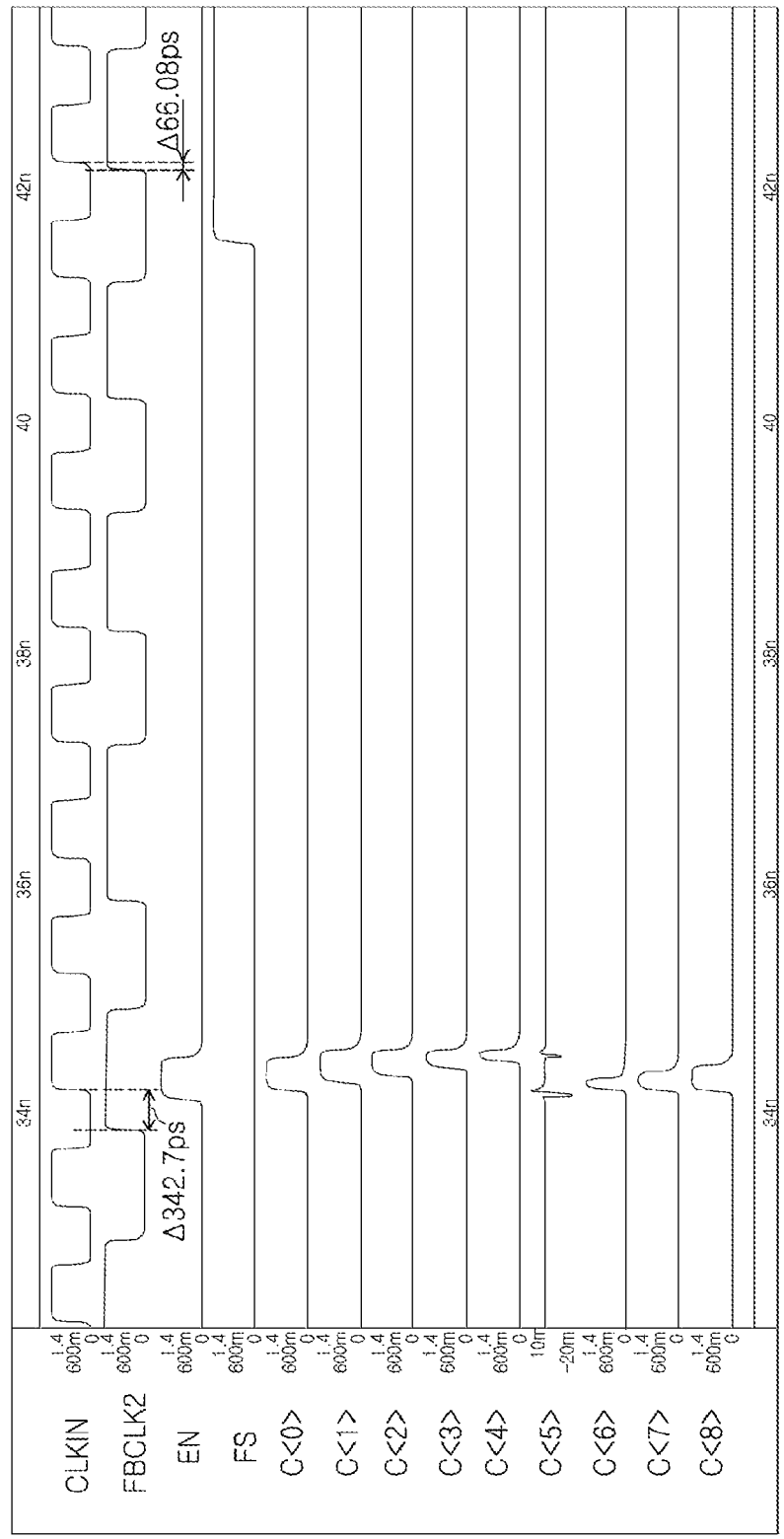
FIG. 8 is a diagram illustrating the output waveforms of a synchronization circuit according to an exemplary embodiment of the invention.

FIG. 8 is a diagram illustrating the output waveforms of a synchronization circuit according to an exemplary embodiment of the invention. As illustrated in FIG. 8, the delay time difference between the input clock signal CLKIN and the divided clock signal FBCLK2 obtained by 2-dividing the feedback clock signal FBCLK is approximately 342 ps (pico second).

However, it can be understood that the delay time difference between the input clock signal CLKIN and the divided clock signal FBCLK2 after setting the initial delay time of the coarse delay chain 500 by reflecting the phase difference detection signal EN is reduced to be equal to or less than 70 ps (approximately 66 ps).

The 70 ps is a value close to the delay time of the unit delay of the coarse delay chain 500. That is, it can be understood that the delay time difference between the input clock signal CLKIN and the divided clock signal FBCLK2 is reduced to a minimum range adjustable by the coarse delay chain 500, so that coarse delay locking is achieved.

Furthermore, it can be understood that among the initial delay time setting signals C<0:8>, the initial delay time setting signals C<5:8> are abnormal due to the operation characteristics of the ring oscillator.

However, as described above, since the shift register 420 according to the exemplary embodiment has been designed in order to substantially prevent an occurrence of abnormal operations caused by the abnormal initial delay time setting signals C<5:8>, it is possible to normally generate the shift signals CT<0:N> and CTB<0:N>.

According to the embodiment, a delay amount to be delayed through a coarse delay chain is measured and reflected in the coarse delay chain once, so that it is possible to reduce a time required for delay locking, thereby quickly achieving the delay locking.

While certain embodiments have been described above, it will be understood to those skilled in the art that the embodiments described are by way of example only. Accordingly, the shift register and the synchronization circuit using the same described herein should not be limited based on the described embodiments. Rather, the shift register and the synchronization circuit using the same described herein should only be limited in light of the claims that follow when taken in conjunction with the above description and accompanying drawings.

What is claimed is:

1. A synchronization circuit comprising:
   a measurement unit configured to measure a difference between an initial delay amount of an input clock signal and an initial delay amount of a feedback clock signal and generate a phase difference detection signal;
   an initial delay time setting unit configured to generate an initial delay time setting signal in response to the phase difference detection signal;
   a shift register configured to generate a shift signal in response to the initial delay time setting signal; and
   a delay chain having an initial delay time set in response to the shift signal.

2. The synchronization circuit according to claim 1, wherein the measurement unit comprises:
   a division section configured to divide the feedback clock signal and generate a divided clock signal; and
   a phase difference detection section configured to detect a phase difference between the input clock signal and the divided clock signal and generate the phase difference detection signal.

3. The synchronization circuit according to claim 1, wherein the initial delay time setting unit comprises:
   an oscillator configured to perform an oscillation operation in response to the phase difference detection signal and generate the initial delay time setting signal.

4. The synchronization circuit according to claim 1, wherein the initial delay time setting unit is configured to output oscillation signals, which are generated in a period corresponding to a pulse width of the phase difference detection signal at a predetermined time difference, as the initial delay time setting signal.

5. The synchronization circuit according to claim 4, wherein the predetermined time difference is substantially identical to a unit delay time of the delay chain.

6. A synchronization circuit comprising:
   a delay chain configured to delay and output an input clock signal;
   a measurement unit configured to generate a phase difference detection signal and an initial delay time setting completion signal in response to the input clock signal and a feedback clock signal;
   an initial delay time setting unit configured to generate a first control signal in response to the phase difference detection signal;
   a control unit configured to generate a second control signal, which corresponds to a result obtained by comparing a phase of the input clock signal with a phase of the feedback clock signal, in response to activation of the initial delay time setting completion signal; and
   a shift register configured to set an initial delay time of the delay chain in response to the first control signal and change a delay time of the delay chain in response to the second control signal.

7. The synchronization circuit according to claim 6, wherein the measurement unit comprises:
   a division section configured to divide the feedback clock signal and generate a divided clock signal;
   a phase difference detection section configured to detect a phase difference between the input clock signal and the divided clock signal and generate the phase difference detection signal; and
   an initial delay time setting completion signal generation section configured to generate the initial delay time setting completion signal in response to the phase difference detection signal and the divided clock signal.

8. The synchronization circuit according to claim 6, wherein the initial delay time setting unit comprises:
   an oscillator configured to perform an oscillation operation in response to the phase difference detection signal and generate the first control signal.

9. The synchronization circuit according to claim 6, wherein the initial delay time setting unit is configured to output oscillation signals, which are generated in a period corresponding to a pulse width of the phase difference detection signal at a predetermined time difference, as the first control signal.

10. The synchronization circuit according to claim 9, wherein the predetermined time difference is substantially identical to a unit delay time of the delay chain.

11. The synchronization circuit according to claim 6, wherein the shift register is configured to shift its own output signal by one cipher in response to the second control signal and shift the output signal by two or more ciphers in response to the first control signal.

12. A synchronization circuit comprising:
    a measurement unit configured to generate a phase difference detection signal and an initial delay time setting completion signal in response to an input clock signal and a feedback clock signal;
    an initial delay time setting unit configured to generate a first control signal in response to the phase difference detection signal;
    a control unit configured to generate a second control signal or a third control signal, which corresponds to a result obtained by comparing a phase of the input clock signal with a phase of the feedback clock signal, in response to activation of the initial delay time setting completion signal;
    a first delay chain configured to delay and output the input clock signal; a second delay chain configured to delay and output an output signal of the first delay chain in response to the third control signal; and
    a shift register configured to set an initial delay time of the first delay chain in response to the first control signal and change a delay time of the first delay chain in response to the second control signal.

13. The synchronization circuit according to claim 12, wherein the measurement unit comprises:
    a division section configured to divide the feedback clock signal and generate a divided clock signal;
    a phase difference detection section configured to detect a phase difference between the input clock signal and the divided clock signal and generate the phase difference detection signal; and
    an initial delay time setting completion signal generation section configured to generate the initial delay time setting completion signal in response to the phase difference detection signal and the divided clock signal.

14. The synchronization circuit according to claim 12, wherein the initial delay time setting unit comprises:
   an oscillator configured to perform an oscillation operation in response to the phase difference detection signal and generate the first control signal.

15. The synchronization circuit according to claim 12, wherein the initial delay time setting unit is configured to output oscillation signals, which are generated in a period corresponding to a pulse width of the phase difference detection signal at a predetermined time difference, as the first control signal.

16. The synchronization circuit according to claim 15, wherein the predetermined time difference is substantially identical to a unit delay time of the delay chain.

17. The synchronization circuit according to claim 12, wherein the shift register is configured to shift its own output signal by one cipher in response to the second control signal and shift the output signal by two or more ciphers in response to the first control signal.

* * * * *